US008648736B2

(12) United States Patent
Kim et al.

(10) Patent No.: US 8,648,736 B2
(45) Date of Patent: Feb. 11, 2014

(54) KEY INPUT DEVICE

(75) Inventors: Youn-Hyoung Kim, Suwon-si (KR); Jin Sagong, Suwon-si (KR)

(73) Assignee: Samsung Electronics Co., Ltd., Suwon-si (KR)

(*) Notice: Subject to any disclaimer, the term of this patent is extended or adjusted under 35 U.S.C. 154(b) by 675 days.

(21) Appl. No.: 12/909,100

(22) Filed: Oct. 21, 2010

(65) Prior Publication Data

US 2011/0095918 A1    Apr. 28, 2011

(30) Foreign Application Priority Data

Oct. 22, 2009  (KR) .................. 10-2009-0100821

(51) Int. Cl.
  *H03M 11/00*    (2006.01)
(52) U.S. Cl.
  USPC .............................. 341/22; 341/26; 345/168
(58) Field of Classification Search
  USPC .................. 341/20–26; 345/168–169
  See application file for complete search history.

(56) References Cited

U.S. PATENT DOCUMENTS

| | | | |
|---|---|---|---|
| 4,015,254 A * | 3/1977 | Strandt | 341/22 |
| 6,184,805 B1 * | 2/2001 | Uggmark | 341/29 |
| 6,737,990 B1 * | 5/2004 | Chau | 341/22 |
| 7,161,505 B1 * | 1/2007 | Falik et al. | 341/26 |
| 7,688,230 B2 * | 3/2010 | DiFatta et al. | 341/22 |
| 8,013,761 B2 * | 9/2011 | Mayer | 341/26 |
| 2006/0152390 A1 * | 7/2006 | Volckers | 341/22 |
| 2007/0139225 A1 * | 6/2007 | Lee | 341/22 |
| 2008/0024326 A1 * | 1/2008 | DiFatta et al. | 341/22 |
| 2008/0079610 A1 * | 4/2008 | Liao | 341/22 |

FOREIGN PATENT DOCUMENTS

| KR | 10-0549917 B1 | 2/2006 |
|---|---|---|
| KR | 10-0639386 B1 | 10/2006 |

* cited by examiner

*Primary Examiner* — Albert Wong
(74) *Attorney, Agent, or Firm* — Jefferson IP Law, LLP (57) ABSTRACT

A key input device for data input means of a device is provided. The key input device includes a first terminal for outputting a key input signal, a second terminal spaced apart from the first terminal and having at least two divided parts, wherein all the divided parts contact the first terminal during a key input operation, at least one resistor allocated to each of the divided parts of the second terminal, connected in parallel to each other, and having respectively different resistance values, and a processor chip for controlling a corresponding key input operation according to respectively different voltage values outputted from the first terminal, by at least one corresponding resistor that is electrically and selectively connected to each of the divided parts.

13 Claims, 6 Drawing Sheets

KEY INPUT DEVICE

PRIORITY

This application claims the benefit under 35 U.S.C. §119(a) of a Korean patent application filed on Oct. 22, 2009 in the Korean Intellectual Property Office and assigned Serial No. 10-2009-0100821, the entire disclosure of which is hereby incorporated by reference.

BACKGROUND OF THE INVENTION

1. Field of the Invention

The present invention relates to a key input device for an input means of a device. More particularly, the present invention relates to a key input device for reducing the number of ports of a processor chip used for key recognition by equally dividing one of an inner terminal or an outer terminal of a switch board into a predetermined number and contacting them.

2. Description of the Related Art

In general, a number of electronic devices including portable terminals use a plurality of key button devices as a data input means. A conventional key button device includes an elastic pad with a plate shape, a plurality of key buttons disposed on the top surface of the elastic pad and having corresponding engraved characters and numbers thereon, and a plurality of protrusions (or actuators) disposed on the bottom surface of the elastic pad. Furthermore, a plurality of Light Emitting Devices (LEDs) for backlighting is included to obtain visibility of the key button device.

Figure 1:
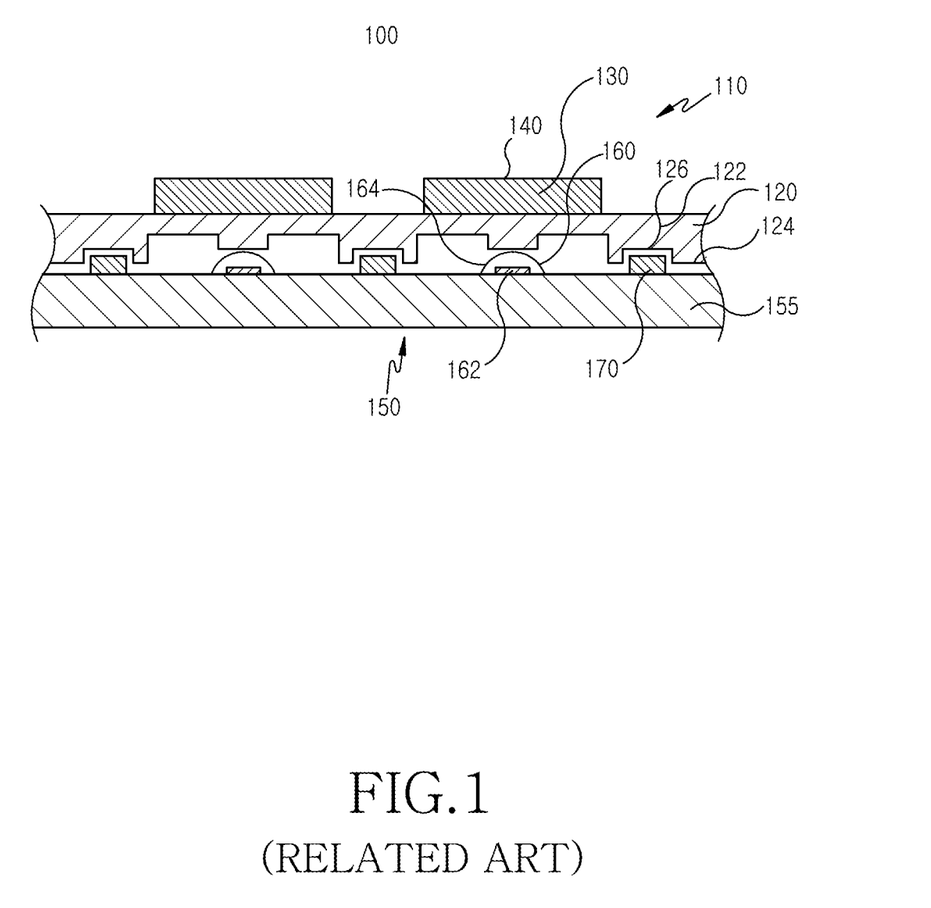
FIG. 1 is a sectional view of a conventional key pad assembly according to the related art.

FIG. 1 is a sectional view of a conventional key pad assembly according to the related art. The key pad assembly 100 includes a key pad 110, a switch board 150, and a plurality of LEDs 170.

Referring to FIG. 1, the key pad 110 includes an elastic pad 120 formed of rubber and having a plate shape, a plurality of key buttons 140 disposed on the top surface 122 of the elastic pad 120 and having printed characters thereon, and a plurality of protrusions disposed on the bottom surface 124 of the elastic pad 120 opposite to the top surface 122. A corresponding protrusion is aligned on the middle of each of the key buttons 140. A plurality of grooves 126 may be formed in the bottom surface 124 of the elastic pad 120. The grooves 126 are disposed around each of the protrusions 130, thereby avoiding interference between the LEDs 170 and the protrusions 130.

The switch board 150 includes a Printed Circuit Board (PCB) 155 with a plate shape and a plurality of switches 160 disposed on the top surface of the PCB 155 opposite to the key pad 110. Each switch 160 consists of a conductive contact member 162 and a conductive dome sheet 164 covering the contact member 162 completely.

Figure 2:
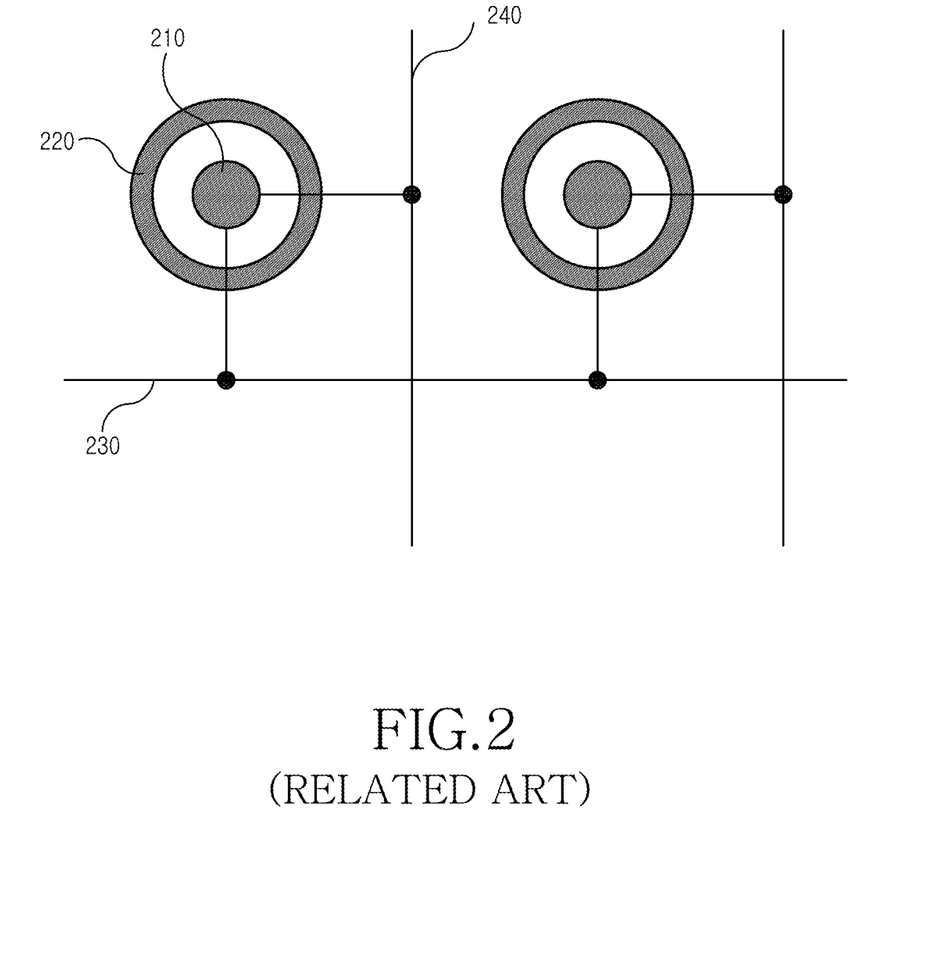
FIG. 2 is a view of a conventional switch board according to the related art.

FIG. 2 is a view of a conventional switch board according to the related art. The switch board consists of an inner terminal 210 and a single outer terminal 220 surrounding the inner terminal 210. The inner terminal 210 and the outer terminal 220 may be connected using a dome sheet. Each key input is accomplished by a combination of a column line 240 and a row line 230. The column line 240 is connected to the inner terminal 210, and the row line 230 is connected to the outer terminal 220. If a signal transmission process using key input is briefly examined, in the key pad assembly structure of FIG. 1, the key button 140 is pressed by a user and the switch 160 below the key button 140 is pressed by the protrusion 130, so that the inner terminal 210 and the outer terminal 220 are connected by the dome sheet constituting the switch 160.

At this point, current flows into a processor chip through the switch connection, and the processor chip detects this flowing current to recognize the input by the user provided through the key button 140. On the contrary, if the switch 160 is disconnected, the inner terminal 210 and the outer terminal 220 are disconnected so that current no longer flows into the processor chip. That is, the key input is detected by ON/OFF of the current inputted into the processor chip.

Referring to FIG. 2, the column line 240 and the row line 230, which are connected to the switch board, are arranged in a matrix and thus constitute each key button input port. That is, in order to realize twelve (3×4) key buttons, the processor chip requires seven pins. If the number of key buttons to be realized is increased, the number of pins in a processor chip is increased in proportion to the number of key buttons.

Accordingly, in order to realize an input device with a number of key buttons such as a Qwerty key, since the number of pins for key input detection is increased in proportion to the number of realized key buttons in a processor chip, a size of the processor chip is increased. As a result, a size of a portable terminal is increased.

Therefore, a need exists for a system and method for providing a key input device that contributes to the miniaturization of a chip, by connecting key buttons with the minimum port and reducing an input/output signal line, to ultimately miniaturize a portable terminal and possibly reduce its manufacturing cost.

SUMMARY OF THE INVENTION

An aspect of the present invention is to address at least the above-mentioned problems and/or disadvantages and to provide at least the advantages described below. Accordingly, an aspect of the present invention is to provide a key input device contributing to the miniaturization of a chip by connecting key buttons with the minimum port and reducing an input/output signal line.

Another aspect of the present invention is to provide a key input device contributing to a slim device according to chip miniaturization by connecting key buttons with the minimum port.

Another aspect of the present invention is to provide a key input device contributing manufacturing cost reduction of a device by connecting key buttons with the minimum port.

According to an aspect of the present invention, a key input device for data input means of a device is provided. The key input device includes a first terminal for outputting a key input signal, a second terminal spaced apart from the first terminal and having at least two divided parts, wherein all the divided parts contact the first terminal during a key input operation, at least one resistor allocated to each of the divided parts of the second terminal, connected in parallel to each other, and having respectively different resistance values, and a processor chip controlling a corresponding key input operation according to respectively different voltage values outputted from the first terminal, by at least one corresponding resistor that is electrically and selectively connected to each of the divided parts.

Other aspects, advantages, and salient features of the invention will become apparent to those skilled in the art from the following detailed description, which, taken in conjunction with the annexed drawings, discloses exemplary embodiments of the invention.

BRIEF DESCRIPTION OF THE DRAWINGS

The above and other aspects, features, and advantages of certain exemplary embodiments of the present invention will be more apparent from the following description taken in conjunction with the accompanying drawings, in which.

Throughout the drawings, it should be noted that like reference numbers are used to depict the same or similar elements, features, and structures.

DETAILED DESCRIPTION OF EXEMPLARY EMBODIMENTS

The following description with reference to the accompanying drawings is provided to assist in a comprehensive understanding of exemplary embodiments of the invention as defined by the claims and their equivalents. It includes various specific details to assist in that understanding but these are to be regarded as merely exemplary. Accordingly, those of ordinary skill in the art will recognize that various changes and modifications of the embodiments described herein can be made without departing from the scope and spirit of the invention. Also, descriptions of well-known functions and constructions may be omitted for clarity and conciseness.

The terms and words used in the following description and claims are not limited to the bibliographical meanings, but, are merely used by the inventor to enable a clear and consistent understanding of the invention. Accordingly, it should be apparent to those skilled in the art that the following description of exemplary embodiments of the present invention are provided for illustration purpose only and not for the purpose of limiting the invention as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

By the term "substantially" it is meant that the recited characteristic, parameter, or value need not be achieved exactly, but that deviations or variations, including for example, tolerances, measurement error, measurement accuracy limitations and other factors known to those of skill in the art, may occur in amounts that do not preclude the effect the characteristic was intended to provide.

FIGS. 1 through 6, discussed below, and the various exemplary embodiments used to describe the principles of the present disclosure in this patent document are by way of illustration only and should not be construed in any way that would limit the scope of the disclosure. Those skilled in the art will understand that the principles of the present disclosure may be implemented in any suitably arranged communications system. The terms used to describe various embodiments are exemplary. It should be understood that these are provided to merely aid the understanding of the description, and that their use and definitions in no way limit the scope of the invention. Terms first, second, and the like are used to differentiate between objects having the same terminology and are in no way intended to represent a chronological order, unless where explicitly state otherwise. A set is defined as a non-empty set including at least one element.

Figure 3:
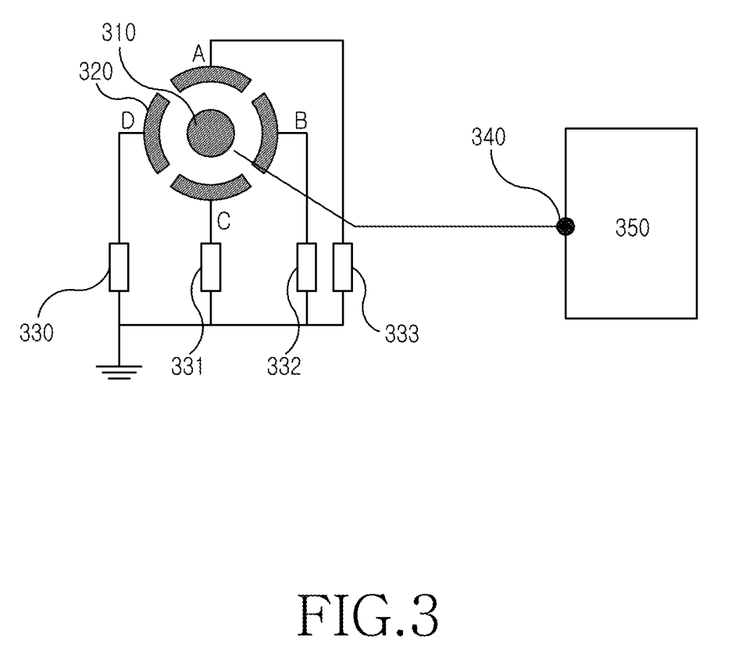
FIG. 3 is a view of a switch board of a portable terminal according to an exemplary embodiment of the present invention.

FIG. 3 is a view of a switch board of a portable terminal according to an exemplary embodiment of the present invention. The switch board includes an inner terminal 310 connected to an analog-digital convertor port (hereinafter, referred to as an Analog-Digital Convertor (ADC) port 340) of a processor chip 350, an outer terminal 320, with equally divided parts, spaced from the circumference of the inner terminal 310, and corresponding resistors 330, 331, 332, and 333 connected in parallel to the plurality of the equally divided parts of the outer terminal 320 and having respectively different resistance values.

The same voltage is applied to the equally divided parts of the outer terminal 320. The resistors 330, 331, 332, and 333, which are electrically connected to each of the divided parts of the outer terminal 320, are configured to have respectively different resistances (Ω). Additionally, the resistors 330, 331, 332, and 333 may be connected in parallel to each other.

In the drawings, the outer terminal 320 is equally divided into four parts i.e., A, B, C, and D and the resistors 330, 331, 332, and 333 having respectively different resistance values are connected in parallel to the four equally divided parts. However, the present invention is not limited thereto and thus, if more data input means is required because of characteristics of the device, the outer terminal 320 may be equally divided into various numbers such as 5, 6, and so forth.

The outer terminal 320 and the inner terminal 310 may be a well-known carbon contact pad. Additionally, a well-known dome sheet is realized with the outer terminal 320. The inner terminal 310 may be formed with a pattern on a printed circuit board (PCB). An important point of this exemplary embodiment of the present invention is that when the outer terminal 320 is pressed by the dome sheet to contact the inner terminal 310, although all of the equally divided parts A, B, C, and D of the outer terminal 320 need to be pressed, each key button is electrically connected to the inner terminal 310 by a different number or only an equally divided portion of a different portion of the outer terminal 320. According to the types (engraved numbers and characters) of a key button pressed, resistance values connected in parallel may vary, and when a predetermined input voltage value enters into the processor chip (or control unit) 350 through the ADC port 340, respectively different output voltage values are provided. Accordingly, the processor chip 350 may control operations of corresponding characters or numbers or corresponding applications through key mapping according to a predetermined corresponding voltage value. That is, the processor chip 350 converts the output voltage value inputted through the ADC port 340 into a software code and recognizes it as a key value.

Referring to FIG. 3, the inner terminal 310 is connected to the ADC port 340 and when a predetermined voltage Vdc is applied to the outer terminal 320, the four equally divided parts A, B, C, and D maintain the predetermined voltage Vdc. The four equally divided parts A, B, C, and D are connected to the inside of the PCB through wiring and in an aspect of hardware, since only necessary wiring is connected to the four equally divided parts A, B, C, and D, when a key is pressed, a wanted signal is passed in terms of a design. The processor chip 350 confirms which key is pressed using a process recognizing a voltage outputted from the inner terminal 310 and converting it into a code through the ADC port 340 connected to the inner terminal 310. For example, when a key is pressed in a pattern where the parts B and C of the outer terminal 320 are wired, the inner terminal 310 and the outer terminal 320 are connected by the dome sheet, such that a voltage is applied to a parallel resistance value and a changed voltage value is delivered to the ADC port 340 of the processor chip 350. Then, the processor chip 350 recognizes a voltage value inputted through the ADC port 340 and converts it into a code value to recognize key input.

Additionally, when a plurality of keys are simultaneously pressed, except for an ADC code about a corresponding voltage value, a wanted digital value may transfer into a chip and an overlapping value may be evaded, such that an error may be determined when the plurality of keys are simultaneously processed.

Next, an example that a switch board consists of four patterns will be explained. For example, resistances applied to corresponding divided parts of the outer terminal 320 may be 70Ω (distribution value 69.3Ω~70.7Ω), 170Ω (distribution value 168.3Ω~171.7Ω), 300Ω (distribution value 297Ω~303Ω), and 500Ω (distribution value 495Ω~505Ω), respectively and are connected in parallel to each other. Additionally, a voltage 1.8V (1.782V~1.818V) may be applied.

In this case, referring to Table 1 below, the number of cases is 15 and respectively different resistance values are calculated according to the corresponding number of cases. That is, according to the (n) number of divided outer parts, the number of cases may be derived from equation (1).

$$\sum_{i=1}^{n} {}_nC_i = \text{Maximum number of patterns} \quad (1)$$

TABLE 1

| Number of cases | Pattern | Origin | Maximum value | Minimum value |
|---|---|---|---|---|
| 1 | A | 70.0 | 69.3 | 70.7 |
| 2 | B | 170.0 | 168.3 | 171.7 |
| 3 | C | 300.0 | 297.0 | 303.0 |
| 4 | D | 500.0 | 495.0 | 505.0 |
| 5 | AB | 49.6 | 49.1 | 50.1 |
| 6 | AC | 56.8 | 56.2 | 57.3 |
| 7 | AD | 61.4 | 60.8 | 62.0 |
| 8 | BC | 108.5 | 107.4 | 109.6 |
| 9 | BD | 126.9 | 125.6 | 128.1 |
| 10 | CD | 187.5 | 185.6 | 189.4 |
| 11 | ABC | 42.6 | 42.1 | 43.0 |
| 12 | ABD | 45.1 | 44.7 | 45.6 |
| 13 | ACD | 51.0 | 50.5 | 51.5 |
| 14 | BCD | 89.2 | 88.3 | 90.1 |
| 15 | ABCD | 39.2 | 38.8 | 39.6 |

TABLE 2

| Output voltage of applied pattern | Minimum value | Maximum value | Key mapping value converted by ADC |
|---|---|---|---|
| 0.83 | 0.82 | 0.84 | 0x52, 0x53, 0x54 |
| 1.21 | 1.20 | 1.23 | 0x78, 0x79, 0x80, 0x81 |
| 1.41 | 1.40 | 1.43 | 0x8C, 0x8D, 0x8E, 0x8F |
| 1.55 | 1.53 | 1.56 | 0x99, 0x9A, 0x9B, 0x9C |
| 0.68 | 0.67 | 0.69 | 0x43, 0x44, 0x45 |
| 0.74 | 0.73 | 0.74 | 0x49, 0x50 |
| 0.77 | 0.76 | 0.78 | 0x4C, 0x4D, 0x4E |
| 1.03 | 1.01 | 1.04 | 0x65, 0x66, 0x67, 0x68 |
| 1.09 | 1.08 | 1.10 | 0x6C, 0x6D, 0x7D |
| 1.25 | 1.24 | 1.26 | 0x7C, 0x7D, 0x7E |
| 0.61 | 0.61 | 0.62 | 0x3D, 0x3E |

TABLE 2-continued

| Output voltage of applied pattern | Minimum value | Maximum value | Key mapping value converted by ADC |
|---|---|---|---|
| 0.64 | 0.63 | 0.65 | 0x3F, 0x40, 0x41 |
| 0.69 | 0.68 | 0.70 | 0x44, 0x45, 0x46 |

Accordingly, referring to Table 2 above, although a predetermined input voltage is applied, respectively different voltage values are outputted using respectively different resistance values according to the number of cases.

That is, referring to Table 2, after respectively different voltage values outputted to the ADC port 340 are detected and then converted into a code value, the processor chip 350 displays a key value such as a character or a number of a corresponding key button and a key mapping value. If it is assumed that the ADC uses 8 bits, it may include 256 steps and it means that if one code is inputted for each 0.01V, it may range from 0 to 2.55V.

For reference, if the number of resistors is increased, since it is hard to determine a resistance value, in this case, a corresponding ADC port may be allocated with another one and then it proceeds.

Figure 4:
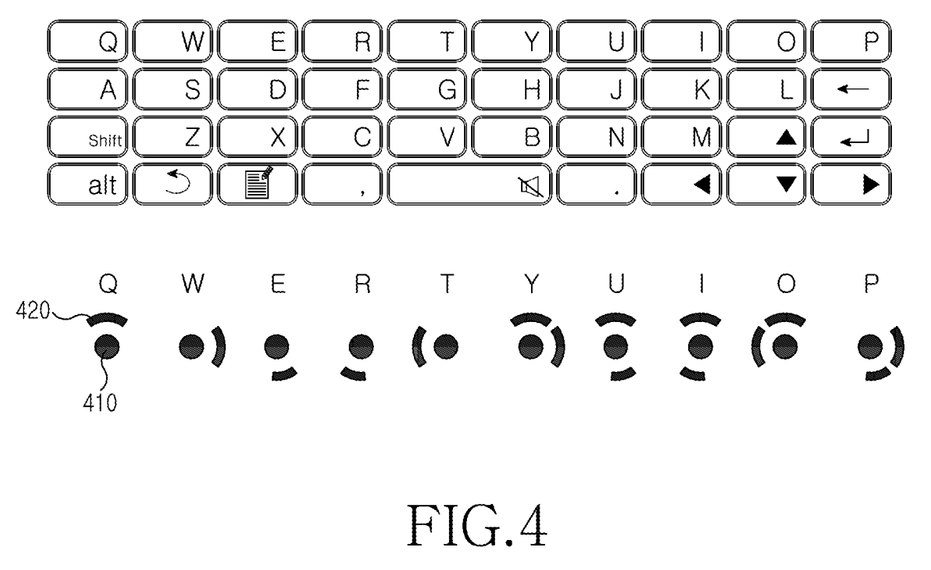
FIG. 4 is a view when a switch board is applied to a Qwerty key according to an exemplary embodiment of the present invention.

FIG. 4 is a view when a switch board is applied to a Qwerty key according to an exemplary embodiment of the present invention.

Referring to FIG. 4, a switch board pattern corresponding to each key button is differently designed and one or a plurality of outer terminals 420 connected through resistors and wirings to correspond to each key is or are shown. Since resistors connected to the outer terminal 420 have respectively different resistance values, when one or a plurality of inner terminals 410 and the outer terminal 420 are connected by pressing a key button, respectively different voltage values corresponding to each key button are outputted in the inner terminal 410.

Figure 5:
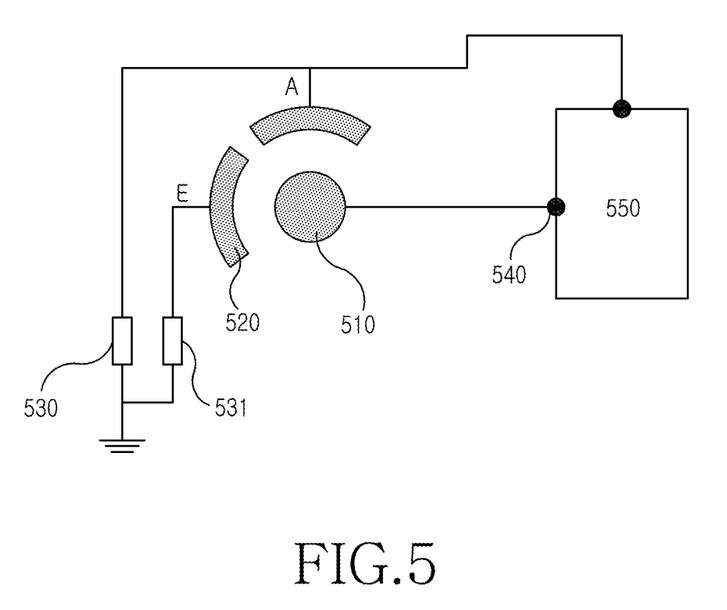
FIG. 5 is a view when a switch board is applied to a wake up call according to an exemplary embodiment of the present invention.

FIG. 5 is a view when a switch board is applied to a wake up call according to an exemplary embodiment of the present invention.

Referring to FIG. 5, an outer terminal 520 having two divided parts A and E is shown. The outer terminal 520 is spaced from the circumference of an inner terminal 510, which is connected to an ADC port 540 of a processor chip 550. FIG. 5 further shows resistors 530 and 531 having respectively different resistance values that are electrically connected to the two divided parts A and E. When a system wakes up by a key button input, power of the outer terminal 520 may be used as an interrupt of a falling edge method with applied pull up. That is, when a key is pressed, interrupt occurs, such that it serves to wake up the system.

Figure 6:
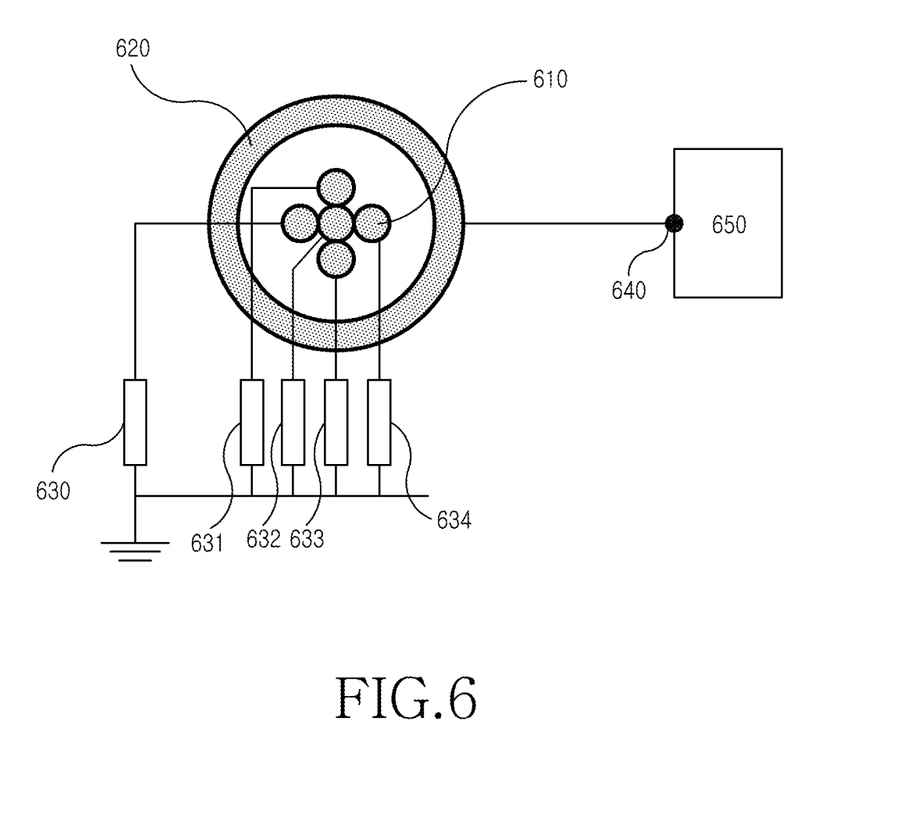
FIG. 6 is a view of a switch board according to another exemplary embodiment of the present invention.

FIG. 6 is a view of a switch board according to another exemplary embodiment of the present invention.

Referring to FIG. 6, the switch board includes an outer terminal 620 connected to an ADC port 640 of a processor chip 650 in a portable terminal, a plurality of circles forming an inner terminal 610, which is spaced apart from and disposed inside the outer terminal 620, and at least one or a plurality of corresponding resistors 630, 631, 632, 633, and 634 having respectively different resistance values connected to the inner terminal 610.

Referring to FIG. 6, the inner terminal 610 of the switch board is formed with five circles having the same size, but may vary in form and number according to the number of required keys. Additionally, at least one resistor connected to the inner terminal 610 is designed to have respectively different resistance values when a key is realized.

Referring to FIG. 6, the outer terminal 620 is connected to the ADC port 640 and a predetermined voltage Vdc is applied to the inner terminal 610, such that the predetermined voltage Vcd is maintained in the five circuits. The inner terminal 610 is connected to the inside of a PCB through wiring, and in an aspect of hardware, since only necessary wiring is connected to the inner terminal 610, when a key is pressed, a wanted signal is passed in terms of a design. The processor chip 650 confirms which key is pressed using a process recognizing a voltage outputted from the outer terminal 620 through the ADC port 640 connected to the inner terminal 610 and converts it into a code.

As mentioned above, according to an exemplary embodiment of the present invention, a switch board of a key input device is designed to allow a processor chip to recognize pressing of a key button through one signal line, such that the number of ports in the processor chip may be minimized. Therefore, a size of the processor chip is reduced and optimized and thus a mounting area on a PCB is minimized. As a result, a portable terminal may be miniaturized and manufacturing cost may be reduced.

While the invention has been shown and described with reference to certain exemplary embodiments thereof, it will be understood by those skilled in the art that various changes in form and details may be made therein without departing from the spirit and scope of the invention as defined by the appended claims and their equivalents.

What is claimed is:

1. A key input device for data input, comprising:
   a first terminal for outputting a key input signal;
   a second terminal spaced apart from the first terminal and having at least two divided parts, wherein all the divided parts contact the first terminal during a key input operation;
   at least one resistor allocated to each of the divided parts of the second terminal, connected in parallel to each other and having respectively different resistance values; and
   a processor chip controlling a corresponding key input operation according to respectively different voltage values outputted from the first terminal, by at least one corresponding resistor that is electrically and selectively connected to each of the divided parts.

2. The key input device of claim 1, wherein the processor chip further comprises an Analog-Digital Convertor (ADC) port for digitalizing an analog signal outputted from the first terminal and delivering it to the processor chip.

3. The key input device of claim 2, wherein the processor chip codes a key input signal inputted to the ADC port and controls to output a corresponding key value for a predetermined corresponding voltage value.

4. The key input device of claim 1, wherein the second terminal is equally divided.

5. The key input device of claim 3, wherein the number of the corresponding key values is the maximum number of patterns derived from the following equation according to the n number of divided second terminals, $$\sum_{i=1}^{n} {}_nC_i = \text{Maximum number of patterns.}$$

6. The key input device of claim 1, wherein the first terminal and the second terminal are disposed on a Printed Circuit Board (PCB).

7. The key input device of claim 6, further comprising a dome sheet on the top surfaces of the first terminal and the second terminal as a key input switch, the key input switch connecting electrically and selectively the first terminal with each of the divided parts of the second terminal according to a pressurizing operation.

8. The key input device of claim 7, wherein the first terminal and the second terminal are carbon contact pads.

9. The key input device of claim 7, wherein when the dome sheet presses the second terminal to contact the first terminal, each divided part of the second terminal is electrically connected to the first terminal by a different resistance value.

10. The key input device of claim 3, wherein the processor chip confirms which key is pressed using a process recognizing a voltage output from the first terminal and converting it into a code through the ADC port connected to the first terminal.

11. The key input device of claim 1, wherein the first terminal is spaced a predetermined distance from the second terminal.

12. The key input device of claim 1, wherein the first terminal is spaced from and disposed inside the second terminal of a hollow type.

13. The key input device of claim 1, wherein the second terminal is spaced from and disposed inside the first terminal of a hollow type.

* * * * *